US007076714B2

(12) United States Patent
Cook, III et al.

(10) Patent No.: US 7,076,714 B2
(45) Date of Patent: Jul. 11, 2006

(54) MEMORY TESTER USES ARBITRARY DYNAMIC MAPPINGS TO SERIALIZE VECTORS INTO TRANSMITTED SUB-VECTORS AND DE-SERIALIZE RECEIVED SUB-VECTORS INTO VECTORS

(75) Inventors: John H Cook, III, Fort Collins, CO (US); Alan S Krech, Jr., Fort Collins, CO (US); Stephen D Jordan, Ft Collins, CO (US); Edmundo De La Puente, Cupertino, CA (US); John M Freesman, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 517 days.

(21) Appl. No.: 10/683,796

(22) Filed: Oct. 10, 2003

(65) Prior Publication Data

US 2004/0078740 A1 Apr. 22, 2004

Related U.S. Application Data

(63) Continuation of application No. 09/628,474, filed on Jul. 31, 2000, now abandoned.

(51) Int. Cl.
*G01R 31/28* (2006.01)
*G06F 11/00* (2006.01)
(52) U.S. Cl. ....................... 714/742; 714/718
(58) Field of Classification Search ............... 714/718, 714/742
See application file for complete search history.

(56) References Cited

U.S. PATENT DOCUMENTS 6,018,817 A * 1/2000 Chen et al. .................. 714/762
6,067,262 A * 5/2000 Irrinki et al. ................ 365/201
6,389,525 B1 * 5/2002 Reichert et al. ............. 711/217

* cited by examiner

Primary Examiner—Guy Lamarre
Assistant Examiner—Mujtaba Chaudry

(57) ABSTRACT

The problem of sequentially "squeezing" small fields of data in a larger data path in and out of a memory device can be solved in an algorithmically driven memory tester by defining sub-vectors to represent data in the small field, where a sequence of sub-vectors represents the data that would be represented by a full sized vector if such a full sized vector could be applied to the DUT. A programming construct in the programming language of the algorithmically driven memory tester allows sub-vectors to be defined, as well as an arbitrary mapping that each is to have. The arbitrary mapping is not static, but changes dynamically as different sub-vectors are encountered. Arbitrary dynamic mappings change as sub-vectors are processed, and may include the notion that, during the activity for a sub-vector, this (or these) bit(s) of a vector do not (presently) map to any pin at all of the DUT. The arbitrary dynamic mapping is implemented by a collection of MUX's configured by data stored ahead of time in an SRAM, in accordance with what defining program constructs are encountered by the compiler as it processes the test program. A dynamic reverse mapper, also a collection of MUX's similarly controlled by an SRAM, serves as a de-serializer that assembles a sequence of received sub-vectors into a final received full-sized vector.

3 Claims, 9 Drawing Sheets

```
1   @group data {0,1,2,3,4,5,6,7}
2   @group address {32,33,34,35,36,37,38,39}
3   @group WnR {40}
4   @group data Valid {41}

5   @acam acambits1st {7:7,6:6,5:5,4:4,3:3,2:2,1:1,0:0}
6   @acam acambits2nd {7:15,6:14,5:13,4:12,3:11,2:10,1:9,0:8}
7   @acam acambits3rd {7:23,6:22,5:21,4:20,3:19,2:18,1:17,0:16}
8   @acam acambits4th {7:31,6:30,5:29,4:28,3:27,2:26,1:25,0:24}
9   @ecam ecambits1st {7:7,6:6,5:5,4:4,3:3,2:2,1:1,0:0}
10  @ecam ecambits2nd {15:7,14:6,13:5,12:4,11:3,10:2,9:1,8:0}
11  @ecam ecambits3rd {23:7,22:6,21:5,20:4,19:3,18:2,17:1,16:0}
12  @ecam ecambits4th {31:7,30:6,29:5,28:4,27:3,26:2,25:1,24:0}
```

```
13  @pattern ACAM_ECAM_BASIC
14  {
15  ACAM_ECAM_BASIC: entry
16  t=0,x=0,y=0,z=0,dh=0,dl=0,a=0,rerr, format dataValid nr=0;
17  dh=0xffff;
18  ymax=15,xmax=15,format WnR nr=1, format address nr, format data nr;
19  LOOP_WRITE: /*now send valid data to DUT*/
20  @acam acambits1st,format dataValid nr=1;
21  @acam acambits2nd;
22  @acam acambits3rd;
23  @acam acambits4th;
24  dl++,dh--,y++,x++(ymax),jump (!xmax || !ymax) LOOP_WRITE,
        format dataValid nr=0;
25  dl=0,x=0,y=0;
26  dh=0xffff,format data cn,format WnR nr=0;
```

*FIG. 6B*

```
27  LOOP_READ: /*now compare data*/
28     @ecam ecambits1st, @acam acambits1st, format dataValid nr=1;
29     @ecam ecambits2nd, @acam acambits2nd;
30     @ecam ecambits 3rd, @acam acambits3rd;
31     @ecam ecambits 4th, @acam acambits4th;
32     dl++,dh--,y++,x++(ymax),jump (!xmax || !ymax) LOOP_WRITE,
       format dataValid nr=0;
33  quit;
34  }
```

MEMORY TESTER USES ARBITRARY DYNAMIC MAPPINGS TO SERIALIZE VECTORS INTO TRANSMITTED SUB-VECTORS AND DE-SERIALIZE RECEIVED SUB-VECTORS INTO VECTORS

REFERENCE TO RELATED APPLICATION

This is a continuation of application Ser. No. 09/628,474 entitled MEMORY TESTER USES ARBITRARY DYNAMIC MAPPINGS TO SERIALIZE VECTORS INTO TRANSMITTED SUB-VECTORS AND DE-SERIALIZE RECEIVED SUB-VECTORS INTO VECTORS, filed Jul. 31, 2000 By John H. Cook III et al., assigned to Agilent Technologies, Inc., and which is now abandoned.

BACKGROUND OF THE INVENTION

Electronics devices and capabilities have grown extremely common in daily life. Along with personal computers in the home, many individuals carry more than one productivity tool for various and sundry purposes. Most personal productivity electronic devices include some form of non-volatile memory. Cell phones utilize non-volatile memory in order to store and retain user programmed phone numbers and configurations when the power is turned off. PCMCIA cards utilize non-volatile memory to store and retain information even when the card is removed from its slot in the computer. Many other common electronic devices also benefit from the long-term storage capability of non-volatile memory in un-powered assemblies.

Non-volatile memory manufacturers that sell to the electronic equipment manufacturers require testers to exercise and verify the proper operation of the memories that they produce. Due to the volume of non-volatile memories that are manufactured and sold at consistently low prices, it is very important to minimize the time it takes to test a single part. Purchasers of non-volatile memories require memory manufacturers to provide high shipment yields because of the cost savings associated with the practice of incorporating the memory devices into more expensive assemblies with minimal or no testing. Accordingly, the memory testing process must be sufficiently efficient to identify a large percentage of non-conforming parts and preferably all non-conforming parts in a single test process.

As non-volatile memories become larger, denser and more complex, the testers must be able to handle the increased size and complexity without significantly increasing the time it takes to test them. As memories evolve and improve, the tester must be able to easily accommodate the changes made to the device. Another issue specific to testing non-volatile memories is that repeated writes to cells of the memories can degrade the overall lifetime performance of the part. Non-volatile memory manufacturers have responded to many of the testing issues by building special test modes into the memory devices. These test modes are not used at all by the purchaser of the memory, but may be accessed by the manufacturer to test all or significant portions of the memories in as little time as possible and as efficiently as possible. Some non-volatile memories are also capable of being repaired during the test process. The tester, therefore, should be able to identify: a need for repair; a location of the repair; the type of repair needed; and, must then be able to perform the appropriate repair. Such a repair process requires a tester that is able to detect and isolate a specific nonconforming portion of the memory. In order to take full advantage of the special test modes as well as the repair functions, it is beneficial for a tester to be able to execute a test program that supports conditional branching based upon an expected response from the device.

From a conceptual perspective, the process of testing memories is an algorithmic process. As an example, typical tests include sequentially incrementing or decrementing memory addresses while writing 0's and 1's into the memory cells. It is customary to refer to a collection of 1's and 0's being written or read during a memory cycle as a "vector", while the term "pattern" refers to a sequence of vectors. It is conventional for tests to include writing patterns into the memory space such as checkerboards, walking 1's and butterfly patterns. A test developer can more easily and efficiently generate a program to create these patterns with the aid of algorithmic constructs. A test pattern that is algorithmically coherent is also easier to debug and use logical methods to isolate portions of the pattern that do not perform as expected. A test pattern that is generated algorithmically using instructions and commands that are repeated in programming loops consume less space in tester memory. Accordingly, it is desirable to have algorithmic test pattern generation capability in a memory tester.

Precise signal edge placement and detection is also a consideration in the effectiveness of a non-volatile tester. In order to capture parts that are generally conforming at a median while not conforming within the specified margins, a non-volatile memory tester must be able to precisely place each signal edge relative in time to another signal edge. It is also important to be able to precisely measure at which point in time a signal edge is received. Accordingly, a non-volatile memory tester should have sufficient flexibility and control of the timing and placement of stimuli and responses from the Device Under Test (memory).

Memory testers are said to generate transmit vectors that are applied (stimulus) to the DUT, and receive vectors that are expected in return (response). The algorithmic logic that generates these vectors can generally do so without troubling itself about how a particular bit in a vector is to get to or from a particular signal pad in the DUT. At this level it is almost as if it were a certainty that adjacent bits in the vector would end up as physically adjacent signals on the DUT. Life should be so kind!

In reality, the correspondence between bits in a vector at the "conceptual level" and the actual signals in the DUT is apt to be rather arbitrary. If nothing were done to prevent it, it might be necessary to cross one or more probe wires as they descend from a periphery to make contact with the DUT. Such crossing is most undesirable, and it is conventional to incorporate a mapping mechanism in the path of the transmit vector to rearrange the bit positions in the transmit vector before they are applied to the DUT, so that task of making physical contact is not burdened with crossings. Receive vectors are correspondingly applied to a reverse mapping mechanism before being considered. In this way the algorithmic vector generation and comparison mechanisms can be allowed to ignore this entire issue. As another example of what such mappers and reverse mappers can do, consider the case when a different instance of the same type of DUT is laid out on the same wafer, but with a rotation or some mirrored symmetry, in order to avoid wasting space on the wafer. These practices also have an effect on the correspondence between vector bit position and physical signal location, but which can be concealed by the appropriate mappings and reverse mappings. It will be appreciated that the mappings and reverse mappings needed for these situations are, once identified for a particular DUT, static, and need not change during the course of testing for that particular DUT.

Now consider a new class of problem, believed to be inadequately addressed by prior art memory testers. Pin connections from an IC to the outside environment are a valuable resource in terms of space available, and are also an expense in their own right. Some manufacturers have taken to multiplexing sequential portions of a word onto a small number of pins, with the assistance of both on-board and external reconstruction. For example, a thirty-two bit value might be "squeezed" through a four bit wide path using eight consecutive "sub-cycles" of information exchange for those four bits. (This is an effective technique in certain applications where performance for some lesser needed function can be sacrificed for some more valuable consideration. We shall term this technique "serialization", and its corresponding operation of reassembling a serialized receive vector, "deserialization".) Upon reflection, we soon come to appreciate certain issues that arise. First, the notion of a static mapping for conceptualized vectors is now inadequate; the mapping would have to change from one sub-cycle of serialization to the next. This happens for the mapping as well as the reverse mapping during deserialization. Although one prior art memory tester allowed vector by vector mappings, the assumption was that these mappings would always fall on or be contained within the boundaries of 8-bit bytes. This is very inconvenient, and a more flexible mechanism tolerating arbitrary mappings is desirable. Next, there are issues concerning how a vector to be serialized is represented at the algorithmic level. It would be most desirable if the vectors dealt with by the algorithmic mechanisms could be left in their assembled form as far as program logic were concerned (i.e., as a single thirty-two bit vector instead of eight vectors each having only four bits that really mean anything). Finally, the different vendors of parts that use this general style of operation may each do it differently in the particular, in that one might involve placing the part in a special mode ahead of time while another has a control signal dedicated to this style operation and that may be invoked at any time as needed. Some definition capabilities are needed within the memory tester to make it flexible enough to handle the existing and future cases of such "data squeezing". Present memory tester architecture is inadequate in this area. Some extensions are needed to facilitate testing of memories that employ serialization. What to do?

SUMMARY OF THE INVENTION

The problem of sequentially "squeezing" small fields of data in a larger data path in and out of a memory device can be solved in an algorithmically driven memory tester by defining sub-vectors to represent data in the small field, where a sequence of sub-vectors represents the data that would be represented by a full sized vector if such a full sized vector could be applied to the DUT. A programming construct in the programming language of the algorithmically driven memory tester allows sub-vectors to be defined, as well as an arbitrary mapping for each. The mapping is not static, in the conventional sense of a single mapping useful for the entire duration of testing a DUT, but changes as different sub-vectors are encountered. We shall call it an arbitrary dynamic mapping. Arbitrary dynamic mappings change as sub-vectors are processed, and may include the notion that, during the activity for a sub-vector, this (or these) bit(s) of a vector do not (presently) map to any pin at all of the DUT.

The arbitrary dynamic mapping is implemented by a collection of MUX's configured by data stored ahead of time in an SRAM, in accordance with what defining program constructs are encountered by the compiler as it processes the test program.

A dynamic reverse mapper, also a collection of MUX's similarly controlled by an SRAM, serves as a de-serializer that assembles a sequence of received sub-vectors into a final received full-sized vector.

It will become apparent during the Description Of A Preferred Embodiment set out below that arbitrary dynamic mappings can simultaneously solve the crossing pin problem, even as they also serve to serialize and de-serialize the movement of sub-vectors out of and into full sized vectors.

Thus, by using a compiler that understands arbitrary dynamic mapping definitions and a memory tester that implements them, test engineers can write algorithmically streamlined test programs for memory devices that employ the data squeezing technique described above. In the embodiment to be described the necessary sub-vector operations are performed automatically as a result of their definition and subsequent invocation, and the programmer need not write code that would otherwise treat each sub-vector as a complete vector in its own right. The compiler should also be compatible with programming constructs for the earlier non-arbitrary dynamic mappings, so that older test programs will still run on new equipment.

BRIEF DESCRIPTION OF THE DRAWINGS

FIGS. 6A–C are an example segment of a test program that illustrates arbitrary dynamic mapping.

DESCRIPTION OF A PREFERRED EMBODIMENTS

Figure 1:
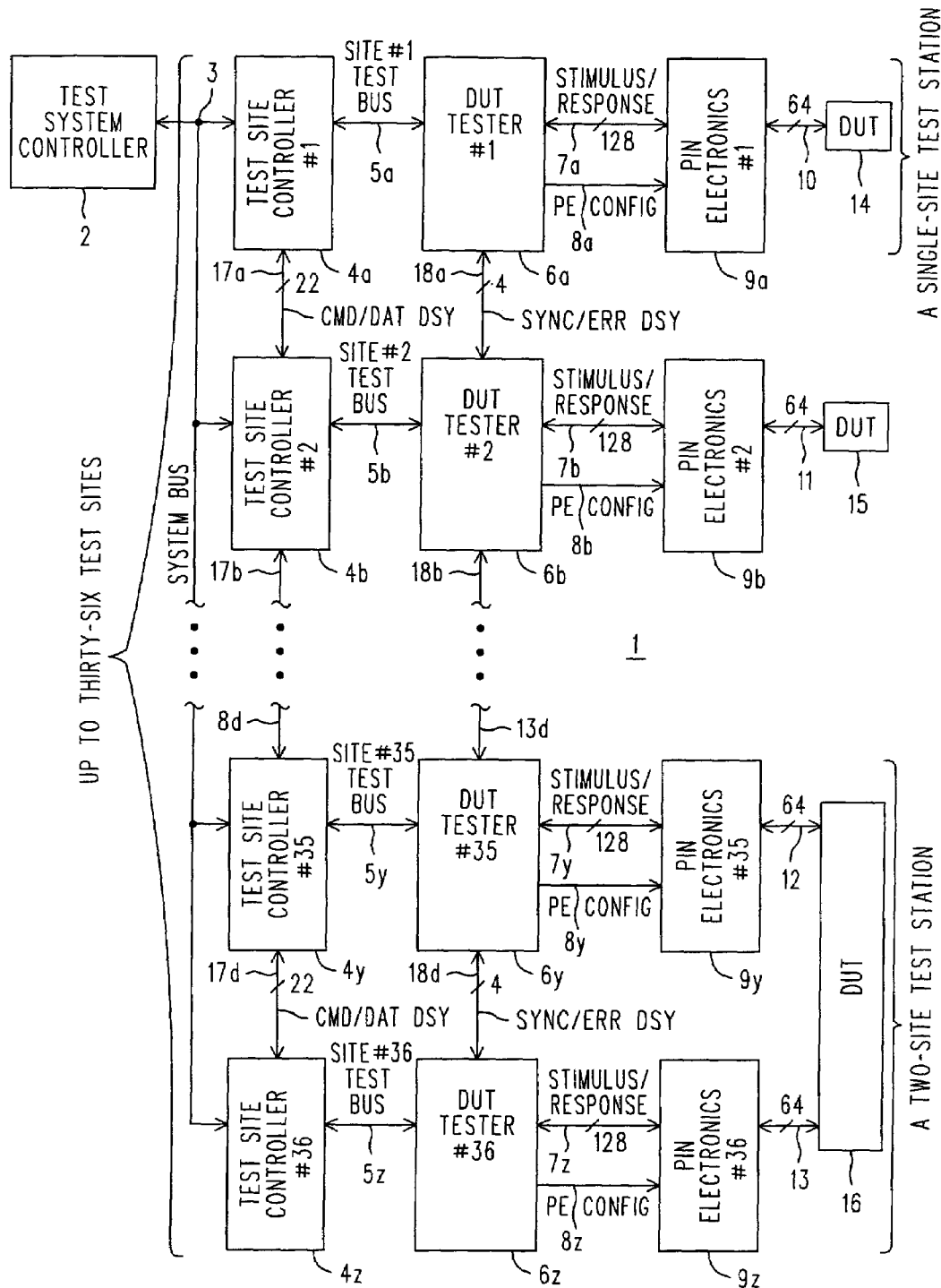
FIG. 1 is a simplified block diagram of an extensively reconfigurable non-volatile memory tester constructed in accordance with the invention.

Refer now to FIG. 1, wherein is shown a simplified block diagram 1 of a Non-Volatile Memory Test System constructed in accordance with the principles of the invention. In particular, the system shown can simultaneously test, with as many as sixty-four test points each, up to thirty-six individual DUT's (Devices Under Test) at one time, with provisions for reconfiguration to allow elements of a collection of test resources to be bonded together to test DUT's having more than sixty-four test points. These test points may be locations on a portion of an integrated circuit wafer that has not yet been diced and packaged, or they might be the pins of a packaged part. The term "test point" refers to an electrical location where a signal may be applied (e.g., power supplies, clocks, data inputs) or where a signal can be measured (e.g., a data output). We shall follow the industry custom of referring to the test points as "channels". The "collection of test resources to be bonded together" referred to above may be understood as being as many as thirty-six test sites, where each test site includes a Test Site Controller (4), a (sixty-four channel) DUT Tester (6) and a (sixty-four channel) collection of Pin Electronics (9) that makes actual electrical connection to a DUT (14). In the case where testing the DUT requires sixty-four or fewer channels, a single Test Site is sufficient to perform tests upon that DUT, and we say, for example, that the Test Site #1 (as it appears in FIG. 1) forms or operates as a "Single Site Test Station". On the other hand, when some form of the aforementioned reconfiguration is in effect, two (or more) Test Sites are "bonded" together to function as one larger equivalent Test Site having one hundred and twenty-eight channels. Accordingly, and again in reference to an example shown in FIG. 1, we say that Test Sites #35 and #36 form a "two-Site Test Station".

To briefly consider the opposite case, one should not assume that an entire Test Site is needed to test a single DUT, or that a single Test Site can test but a single DUT. Suppose that a wafer had two (probably, but not necessarily, adjacent) dies, the sum of whose test channel requirements were sixty-four channels or less. Both DUT's can be tested by a single Test Site. What makes this possible is the general purpose programmability of each Test Site. A test program executed by the Test Site may be written such that one part of the Test Site's resources is used to test one of the DUT's while another part is used to test the other DUT. After all, we would assume that if we had a third DUT that were the logical union of the first two, then we would be able to test that third DUT with a single Test Site, so we ought to be able to similarly test its "component DUT's", as it were. The only difference is individually keeping track of whether the two "component DUT's" pass or fail, as opposed to a unified answer for the "third" DUT (that is, there is an issue concerning what portion of the "third" DUT failed). This "Single-Site Multi-Test Station" capability is largely conventional, and we mention it here for the sake of completeness, and to ward off potential confusion and misunderstanding when comparing it to the notion of bonding two or more Test Sites together.

Were it not for this notion of reconfiguration there would be no difference between a Test Site and a Test Station, and we would dispense with one of the terms. As it is, however, it will be readily appreciated that the number of Test Stations need not equal the number of Test Sites. In the past, the numbers could be different because Test Sites were split to create more Test Stations (DUT's not complex enough to consume an entire Test Site). Now, however, the difference may also be due to Test Sites having been bonded together to form multi-site Test Stations (DUT's too complex for a single Test Site).

To continue, then, a Test System Controller 2 is connected by a System Bus 3 to as many as thirty-six Test Site Controllers whose names end in the suffixes #1 through #36 (4a–4z). (It is true that subscripts a–z only go from one to twenty-six, and not to thirty-six. But this minor deception seems preferable over numerical subscripts on numerical reference characters, which would be potentially very confusing.) The Test System Controller 2 is a computer (e.g., a PC running NT) executing asuitable Test System Control Program pertaining to the task of testing non-volatile memories. The Test System Control Program represents the highest level of abstraction in a hierarchical division of labor (and of complexity) for accomplishing the desired testing. The Test System Controller determines which programs are being run by the different Test Sites, as well as overseeing a robotics system (not shown) that moves the test probes and DUT's as needed. Test System Controller 2 may function in ways that support the notion that some Test Sites are programmed to perform as single-site Test Stations, while others are bonded together to form multi-site Test Stations. Clearly, in such circumstances there are different parts being tested, and it is most desirable that different tests be used for the different parts. Likewise, there is no requirement that all single-site Test Stations be testing the same style of part, nor is there any such requirement for multi-site Test Stations. Accordingly, the Test System Controller 2 is programmed to issue the commands to accomplish the needed Test Site bonding and then to invoke the appropriate test programs for the various Test Stations in use. The Test System Controller 2 also receives information about results obtained from the tests, so that it may take the appropriate action for discarding the bad part and so that it may maintain logs for the various analyses that may be used to control, say, production processes in a factory setting.

The Test System itself is a fairly large and complex system, and it is common for it to use a robotics subsystem to load wafers onto a stage that then sequentially positions one or more future dies under probes connected to the Pin Electronics 9, whereupon those future dies (the wafer has not yet been diced) are tested. The Test System can also be used to test packaged parts that have been loaded onto a suitable carrier. There will be (as is explained below), at least one Test Site Controller associated with each Test Station in use, regardless of how many Test Sites are used to form that Test Station, or of how many Test Stations are on a Test Site. A Test Site Controller is an embedded system that may be an i960 processor from Intel with thirty-six to sixty-four MB of combined program and data memory running a proprietary operating system called VOS (VersaTest O/S), which was also used in earlier products for testing non-volatile memories (e.g., the Agilent V1300 or V3300). For the moment, we shall consider only the situation for single-site Test Stations. For the sake of a definite example, suppose that Test Site #1 is functioning as Test Station #1, and that it is to test the WHIZCO part no. 0013. The test regimen involves a hundred or so different types of tests (varying and monitoring voltage levels, pulse widths, edge positions, delays, as well as a large dose of simply storing and then retrieving selected patterns of information), and each type of test involves many millions of individual memory cycles for the DUT.

At the highest level, the operators of the Test System instruct the Test System Controller 2 to use Test Station #1 to begin testing WHIZCO 0013's. In due course the Test System Controller 2 tells Test Site Controller #1 (4a) (which is an embedded [computer] system) to run the associated test program, say, TEST_WHIZ_13. If that program is already available within Test Site Controller#1's environment, then it is simply executed. If not, then it is supplied by the Test System Controller 2.

Now, in principle, the program TEST_WHIZ_13 could be entirely self-contained. But if it were, then it would almost certainly be rather large, and it may be difficult for the processor of the embedded system within the Test Site Controller 4a to run fast enough to produce the tests at the desired speed, or even at a rate that is uniform from one DUT memory cycle to the next. Accordingly, low level subroutine type activities that generate sequences of address and associated data that is to be written or is expected from a read operation, are generated as needed by a programmable algorithmic mechanism located in the DUT Tester 6, but that operates in synchrony with the program being executed by the embedded system in the Test Site Controller 4. Think of this as exporting certain low level subroutine-like activity and the task of initiating DUT memory cycles out to a mechanism (the DUT Tester) that is closer to the hardware environment of the DUT 14. Generally speaking, then, whenever the Test System Controller 2 equips a Test Site Controller with a test program it also supplies the associated DUT Tester with appropriate low level implementation routines (perhaps specific to the memory being tested) needed to accomplish the overall activity described or needed by the programming for the Test Site Controller. The low level implementation routines are termed "patterns", and they are generally named (just as functions and variables in high level programming languages have names).

Each Test Site Controller #n (4) is coupled to its associated DUT Tester #n (6) by a Site Test Bus #n (5). The Test Site Controller uses the Site Test Bus 5 to both control the operation of the DUT Tester and receive therefrom information about test outcomes. The DUT Tester is capable of generating at high speed the various DUT memory cycles that are involved in the test regimen, and it decides if the results of a Read memory cycle are as expected. In essence, it responds to commands or operation codes ("named patterns") sent from the Test Site Controller by initiating corresponding useful sequences of Read and Write DUT memory cycles (i.e., it executes the corresponding patterns). Conceptually, the output of the DUT Tester 6 is stimulus information that is to be applied to the DUT, and it also accepts response information therefrom. This stimulus/response information 7a passes between the DUT Tester 6a and a Pin Electronics #1 assembly 9a. The Pin Electronics assembly 9a supports up to sixty-four probes that can be applied to the DUT 14.

The above-mentioned stimulus information is just a sequence of parallel bit patterns (i.e., a sequence of "transmit vectors" and expected "receive vectors") expressed according to the voltage levels of some family of logic devices used in the DUT Tester. There is a configurable mapping between bit positions within a stimulus/response and the probes on the die, and this mapping is understood by the DUT Tester 6. The individual bits are correct as to their timing and edge placement, but in addition to the mapping they may also need voltage level shifting before they can be applied to the DUT. Likewise, a response that originates in the DUT subsequent to a stimulus may need buffering and (reverse) level shifting before it can be considered suitable for being fed back to the DUT Tester. These level shifting tasks are the province of the Pin Electronics 9a. The Pin Electronics configuration needed for testing a WHIZCO 0013 likely will not work for testing a part from the ACME Co., and perhaps not even with another WHIZ Co. part. So, it will be appreciated that the Pin Electronics assembly needs to be configurable also; such configurability is the function of the PE Config lines 8a.

The above concludes a brief architectural overview of how a single Test Site is structured for testing a DUT. We turn now to issues that arise when there are many Test Sites with which to operate. As a preliminary, we shall describe a preferred embodiment for constructing a Test System having multiple Test Sites. In many respects, some of the information we are about to describe are matters of choice based on market studies of customer preference and cost benefit analyses. Be that as it may, to build one of these things one has to make definite choices, and once that is done there are particular consequences that are visible throughout the entire system. It is felt that it is useful to describe, at least in a general way, the larger outlines of the hardware properties of the Test System. Even though some of these properties are contingent, a knowledge of them will nevertheless assist in an appreciation of various examples used to illustrate the invention.

To begin, then, consider four rather large card cages. Each card cage has, besides power supplies and water cooling (fans can be a source of contamination in a clean room environment), a mother board, a front plane and a back plane. Into each card cage can be placed up to nine assemblies. Each assembly includes a Test Site Controller, DUT Tester and Pin Electronics. We shall be describing the general outlines of how Test Site Controllers are bonded together, which will involve some busses used to create daisy chains.

A brief digression concerning the term "daisy chain" is perhaps in order. Consider system elements A, B, C and D. Suppose that they are to be daisy chained together in that order. We could say that there is an information or control path that leaves A and goes into B, that B can selectively pass on traffic that then leaves B and goes into C, and that C can selectively pass on traffic that then goes into D. These same kind of arrangements can exist for traffic in the other direction, too. Daisy chains are often used to create priority schemes; we shall use them to create master/slave relationships between various the Test Site Controllers. We shall denote these daisy chained style communication arrangements with the suffix noun "DSY", instead of "BUS". Thus, we might refer to a Command/Data DSY instead of a Command/Data Bus. Now, the notion that information "enters B and is selectively passed on" may suggest that traffic is replicated onto a separate set of conductors before being passed on. It could be that way, but for performance reasons it is more like a regular bus having addressable entities. By means of a programmable address mapping arrangement and the ability to put portions of downstream Test Site Controllers "to sleep," the single bus can be made to logically appear (i.e., to function) as a plurality of daisy chains. Finally, it will be appreciated that the daisy chains are high performance pathways for command and control information, and that if they were not, then we could not expect a master/slave combination (multi-site Test Station) to operate as fast as a single Test Site does. For the benefit of daisy chain performance, the various DSY do not leave their respective card cages. The effect of this decision is to place some limits on which Test Sites (and thus also how many) can be bonded together. In principle, there is no fundamental need for this limitation, nor is there a genuine lack of technical practicality involved (it could be done); it is simply felt that, since there are already nine Test Sites in a card cage, extending the DSY's adds significant cost for relatively little additional benefit.

To resume our discussion of FIG. 1, then, consider the various Test Site Controllers 4a–4z that can populate the four card cages, each with nine Test Site Controllers. Let's denote them as 4a–4f, 4g–4m, 4n–4t and 4u–4z. (Never minding, as explained earlier, that these are nominally only twenty-six subscripts—the reader is invited to imagine that there are another ten subscript symbols in there, someplace.) A CMD/DAT DSY 17a (Command & Data Daisy Chain) interconnects the Test Site Controller 4a–4f that are in one card cage, while a different CMD/DAT DSY 17b interconnects the Test Site Controllers 4g–4m in another card cage. The same arrangement exists for the remaining card cages, and Test Site Controllers 4n–4t and 4u–4z, respectively. We have earlier said that the DSY do not leave the card cages, in that "tail end" of a bus that actually forms the DSY does not leave a card cage and become the head of the next segment in another card cage. Instead, the System Bus 3 from the Test System Controller 2 goes to all Test Site Controllers, and each is capable of becoming a Master at the head of a DSY segment that does not leave the card cage.

The CMD/DAT DSY 17*a*–*d* that we have been discussing exist between the various Test Site Controllers 4*a*–4*z*. There is a similar arrangement for the SYNC/ERR DSY 18*a*–18*d* and the DUT Testers 6*a*–6*z*. The synchronization and error information conveyed by the SYNC/ERR DSY 18 allows DUT Testers to function in unison. These two daisy chains (17 and 18) carry slightly different types of information, but each exists as part of the same general mechanism for bonding one or more Test Sites together into a Test Station.

Figure 2:
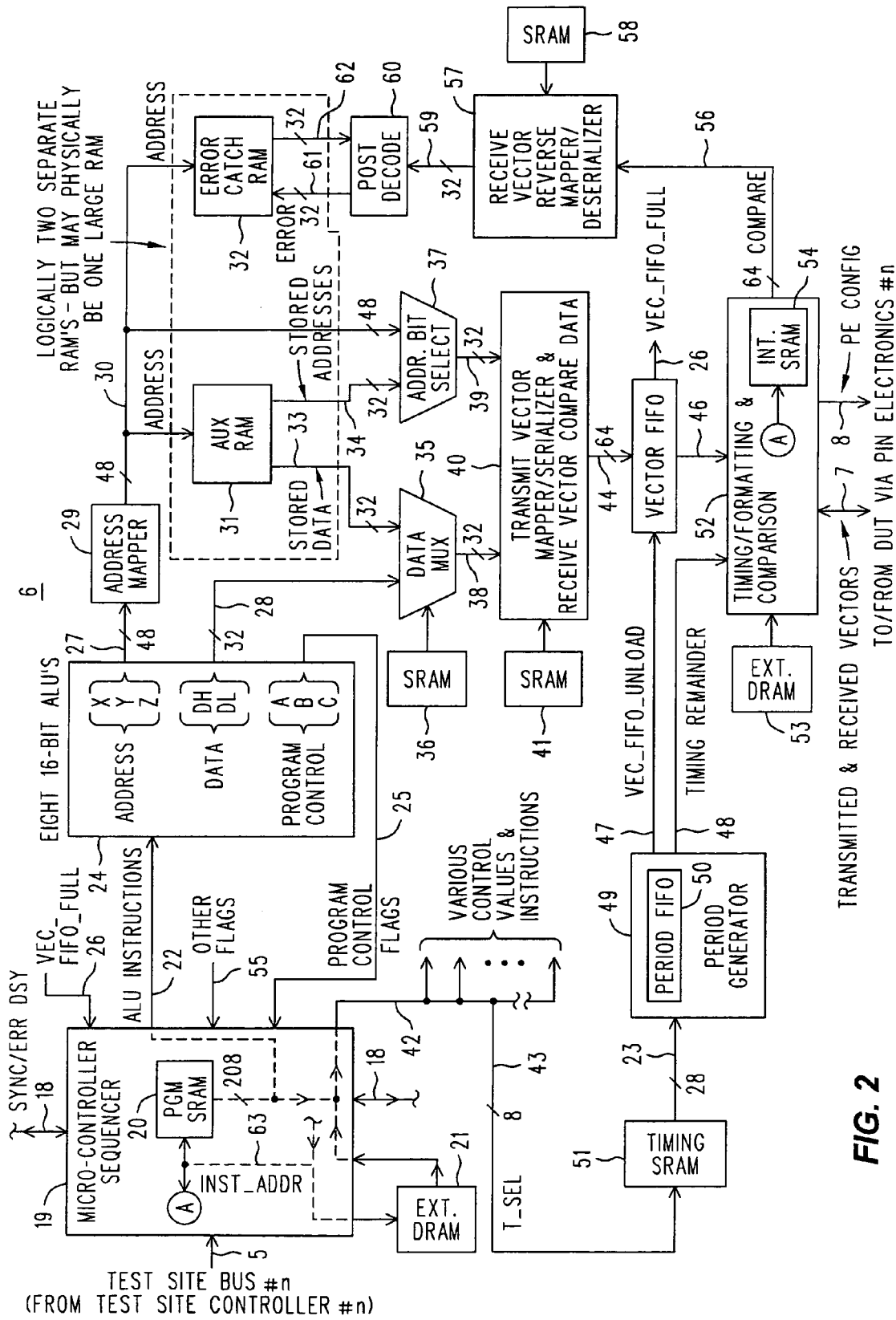
FIG. 2 is a simplified block diagram expansion of the DUT tester 6 of FIG. 1.

We turn now to a discussion of FIG. 2, which is a simplified block diagram expansion of the DUT tester 6 of FIG. 1, of which there may be as many as thirty-six. It is sufficient at present to describe only one instance thereof. A glance at FIG. 2 will show that it is a fairly well populated with stuff; especially so for a "simplified" block diagram. Some of what is in the DUT Tester 6 and represented in the block diagram is functionally quite complicated, and is not available in "off the shelf" form. It is appropriate here to make two points. First, the primary purpose of including FIG. 2 is to describe the basic properties of an important operational environment within the overall Non-Volatile Memory Test System 1. The invention(s) that are fully described in connection with FIG. 3 and subsequent figures will either be expansions of mechanisms set out in the following description of FIG. 2, or they will be new mechanisms whose motivational premise is found in FIG. 2. Either way, as this is written it is not known exactly which of these is before the reader. The goal at present is to provide a simplified yet informative starting point for numerous different Detailed Descriptions of various Preferred Embodiments, so that each of those can be as concise as is appropriate (as opposed to one "jumbo" Specification that discloses everything about each different invention). The second point is that the expanded or extended material, while in general overall agreement with FIG. 2, may contain information that does not "match-up" exactly with the simplified version. This does not mean there has been an error, or that things are fatally inconsistent; it arises because it is sometimes difficult or impossible to simplify something such that it is the exact image in miniature. The situation is rather like maps. A standard size road map of Colorado will show that when going east on I-70 you can go north on I-25 at Denver. It looks like a left turn. And while it did used to be an actual left turn, it isn't one now, and a detailed map of that intersection will show a sequence of component turns and intervening road sections. But no one would say that the standard size road map is wrong; it is correct for its level of abstraction. Similarly, and despite its fairly busy appearance, FIG. 2 is indeed a simplification operating at a medium level of abstraction, but some seeming left turns are not simple left turns at all.

As is shown in FIG. 1, the major input to the DUT Tester 6 is an instance of the Test Site Bus 5, which originates from a Test Site Controller 4 that is associated with the instance of the DUT Tester 6 that is of interest. The Test Site Bus 5 is coupled to a Micro-Controller Sequencer 19, which may be likened to a special purpose microprocessor. It fetches instructions from a program stored in a program memory, which may be either internal to the Micro-Controller Sequencer 6 (PGM SRAM 20) or external thereto (EXT. DRAM 21). Although these two memories appear to be addressed by what is essentially a logically common address 63 that serves as a program counter (or, instruction fetch address), and either can be a source of programming to be executed, note that: (1) Only one of the memories performs instruction fetch memory cycles during any period of time; and (2) In fact they are addressed by electrically different signals. The SRAM is fast and allows genuine random access, but consumes valuable space within the Micro-Sequence Controller 19 (which is a large IC), so its size is limited. The external DRAM can be provided in adjustable amounts of considerable quantity, but is fast only when accessed in sequential chunks involving linear execution and no branching. Programming in the SRAM 20 most often that which is intensely algorithmic, while the EXT. DRAM 21 is best suited for material not readily generated by algorithmic processes, such as initialization routines and random or irregular data.

The instruction word executed by the Micro-Controller Sequencer 19 is fairly wide: two hundred and eight bits. It consists of thirteen sixteen-bit fields. These fields often represent fetched instruction information for mechanisms that are outside the Micro-Controller Sequencer proper. Such fields are dedicated to their associated mechanisms. One set of ALU INSTRUCTIONS 22 are applied to a collection of eight sixteen-bit ALU's 24, while others are disbursed to various other mechanisms distributed throughout the DUT Tester. This latter situation is represented by the lines and legend "VARIOUS CONTROL VALUES & INSTRUCTIONS" 42.

The eight sixteen-bit ALU's (24) each have a conventional repertoire of arithmetic instructions built around associated sixteen-bit result registers (each ALU has several other registers, too). Three of these result registers and their associated ALU's are for generating X, Y and Z address components 27 that are variously combined into a complete address to supplied to the DUT. Two more of the eight ALU/registers (DH & DL) are provided to assist in the algorithmic creation of thirty-two bit data patterns 28 that are divided between a most significant portion (DH) and a least significant portion (DL). A final three ALU/registers (A, B, C) are used as counters and contribute to the production of various PROGRAM CONTROL FLAGS 25 that assist with program control and branching on completion of some programmatically specified number of iterations or other numerical condition. These PROGRAM CONTROL FLAGS 25 are sent back to the Micro-Controller Sequencer 19, where they affect the value of the instruction fetch address in ways familiar to those who understand about microprocessors. There are also various OTHER FLAGS 55 that also can be used to effect program branching. These originate with various ones of the other mechanisms within the DUT Tester 6 that are controlled by the different fields of the fetched instruction word. One specific additional flag is expressly shown as a separate item: VEC_FIFO_FULL 26. In another drawing having somewhat less detail it might be lumped in along with the OTHER FLAGS 55. We have separated it out to assist in explaining one aspect of the operation of the Micro-Controller Sequencer 19.

What VEC_FIFO_FULL does is to (temporarily) halt further program execution by the Micro-Controller Sequencer 19. There are many stages of pipeline between the instructions fetched by the Micro-Controller Sequencer 19 and the mechanism that finally hands test vectors off to be applied to the DUT. In addition, part of the baggage that accompanies a vector as it moves toward being applied to the DUT is information concerning the rate of eventual vector application, or, each vector's duration. Thus, the rate of vector application to the DUT need not be constant, and in particular, a group of vectors may take longer to apply than they did to generate. The Micro-Controller Sequencer simply executes programming at its maximum rate. But clearly, on average, the rate of "vector consumption," as it were, must equal the rate of "vector production," lest the pipeline need to be elastic nearly without limit. There is a Vector FIFO 45 at the output of the Address Mapper 29 discussed below, and it serves as an elastic capacity in the pipeline. The signal VEC_FIFO_FULL is used to prevent overrunning the limited number of stages in the pipeline, by causing a temporary cessation in the production of new vectors at the head end of the pipe.

To continue, the (three times sixteen equals forty-eight bits of) X, Y and Z address components 27 are applied to an Address Mapper 29, whose output is a selected-in-advance nearly arbitrary rearrangement of the address values in the ordered forty-eight bit address space. As a point of departure for appreciating this, suppose for a moment that the Address Mapper 29 were a memory that fully populated a forty-eight bit address space, and that it held a forty-eight bit value at each address. (Temporarily never mind that such a memory would—today anyway—be size of a large refrigerator.) Given such a memory, a look-up table could be implemented that could map any applied address into another, arbitrarily selected, forty-eight bit value which could then be used as a replacement address. The reason that such address mapping is desirable is that the X, Y and Z address components generally have useful meaning in the context of a particular DUT's internal architecture, which is most likely not implemented with one big linear decoder. The notions of rows, columns and layers, block or pages may be very useful to the Test Engineer, and failures that occur in locations that are physically close together may involve corresponding closeness in their X, Y and Z addresses. Such patterns in the test results can be valuable in appreciating what is wrong and in trying to fix it, whether at a design level or at a production level of reprogramming a part to shunt a defective section's operation with that of a spare section. Two issues arise from such thinking. The first is paring the forty-eight bits down to the actual number of bits (say, thirty-two, or perhaps sixteen) to be applied to the DUT. That is not presently part of the address mapper function (although if we really did have the assumed forty-eight bit addressable memory then it could be). We shall shortly briefly mention how the paring down is done, and it is largely a matter of taking this many bits from X, that many from Y and the rest from Z. But not entirely, and this is the second issue, because certain addresses might lie within circuitry that is a left-for-right (or left-for-right and top-for bottom) mirror image of another section of circuitry. This has the effect of rearranging what the bits mean, as far as what sequential address values are in physical order within that circuitry.

This chip layout property may occur many times, and it may well be the case that how one group of bits for, say, Y, are interpreted, may depend upon the accompanying value of some other, say, Z bits. The address mapper 29 is provided to allow the raw X, Y and Z addresses to be "repackaged," as it were, to reflect this sort of thing for the benefit of those who would test memories having such internal architectural arrangements. As to how its actually done, the Address Mapper 29 is constructed of a fairly large number of interconnected multiplexers. It cannot implement the completely arbitrary look-up table behavior of a fully populated memory decode scheme as was temporarily assumed above for purposes of explanation. It can however, rearrange sub-fields of the X, Y and Z address components as needed, particularly since there is yet another mechanism that will do the paring down from forty-eight bits to the actual number needed. The Address Mapper 29 also contains three sixteen bit (address) look-up tables that allow it to perform limited arbitrary mapping within local ranges.

The mapped address output 30 of the Address Mapper 29 is applied as an address to an Aux RAM 31 and to an Error Catch RAM 32, which, while having separate functions, may nevertheless be implemented selectable partitions in one larger overall RAM. The mapped address output 30 is also applied as one input to an Addr. Bit Select circuit 37, which is described below.

Consider the Aux RAM 31. Its function is to retain data patterns 33 and addresses 34 that can be applied to the DUT. These are logically separate outputs from the Aux RAM 31, since they are treated somewhat differently and used in different places. (The AUX RAM 31 is not a dual "port memory", but is preferably of several banks whose outputs are applied to MUX's.) In keeping with this, it may be that Stored Data 33 is kept in one bank or range of addresses of the Aux RAM 31, while Stored Addresses 34 are kept in another. Also, we have not shown an explicit mechanism for writing to the Aux RAM 31. That is accomplished by an addressed bus operation initiated by a Test Site Controller 4 at the behest of the program it is executing. (There is an "under the floorboards," as it were, "utility services" bus called the "Ring Bus" [not shown—as it would clutter the drawing immensely] that goes to just about everything in FIG. 2.)

The Error Catch RAM 32 is addressed by the same address that is applied to the Aux RAM 31, and it either stores or retrieves information about errors, which operations are performed in conjunction with a Post Decode Circuit, to be discussed later. As with the paths 33 and 34 from the Aux RAM 31, paths 61 (into the Error Catch RAM) and 62 (from the Error Catch RAM) are preferably MUX'ed outputs from a multi-bank memory (the Error Catch RAM 32 ), in accordance with configuration information distributed by the Ring Bus (not shown).

Note that the Data MUX 35 has as inputs the STORED DATA output 33 from the Aux RAM 31 as well as data 28 from the registers DH and DL in the collection 24 of ALU's. The Data MUX 35 selects which of these inputs (28, 32) to present as its output 38, which is then applied as one of two vector components to a Transmit Vector Mapper/Serializer/Receive Vector Compare Data Circuit 40 (the other component is the output 39 of the Addr. Bit Select circuit 37). Data MUX 35 performs this selection in accordance with values stored in an SRAM 36 that is addressed in accordance with a field in the two hundred and eight bit instruction fetched by the Micro-Controller Sequencer 19.

Circuit 40 can perform three functions: assemble vector components (38, 39) into an ordered logical representation an entire vector that is to be applied (transmitted) to the DUT; apply an arbitrary dynamic correspondence (mapping) between the ordered bits of the logical representation of the transmit vector and the actual physical channel number of the Pin Electronics (i.e., which probe tip) will contact the DUT on behalf of that signal (i.e., that bit in the vector); and, cooperate with the compiler in the division of an entire logical vector into pieces to be applied separately and in order (serialization) for DUT's that admit of such a thing. Which of these functions is performed is determined by control signals from an SRAM 41, which is also addressed in accordance with a field in the two hundred and eight bit instruction fetched by the Micro-Controller Sequencer 19.

The output of Circuit 40 is an up to sixty-four bit vector 44 that is applied to a Vector FIFO 45, which when full generates the signal VEC_FIFO_FULL 26, whose meaning and use was discussed above. The vector at the top of the Vector FIFO 45 is removed therefrom upon receipt of a signal VEC_FIFO_UNLOAD 47 that originates at a Period Generator 49 (to be discussed shortly). Such removed vectors (46) are applied to a Timing/Formatting & Comparison circuit 52 that is connected to the DUT via the associated instance of Pin Electronics 9. That is, each instance of Pin Electronics 9 receives Transmitted & Received Vectors 7 and Pin Electronics configuration information 8 from its associated Timing/Formatting & Comparison circuit 52.

The Timing/Formatting & Comparison circuit 52 has an Internal SRAM 54 addressed by the same Instruction Address ("A" in the small circle) as is the Program SRAM 20 of the Micro-Controller Sequencer 19. (An External DRAM 53 may be used in place of the Internal SRAM 54.) The Internal SRAM 54 (or external DRAM 53) assists in the production of Drive and Comparison cycles. Drive cycles apply a transmit vector to the DUT. Comparison cycles receive a vector presented by the DUT and examine it to determine if it matches previously supplied comparison data. Both Drive and Comparison cycles are adjustable as to their duration, whether and when a load is applied, and when data is latched or strobed. The comparison produces a sixty-four bit value 56 that is applied to a Receive Vector Reverse Mapper/Deserializer 57, whose function may be considered to be the logical inverse of circuit 40. (The operation of circuit 57 is controlled by an SRAM 58 that corresponds to the control of circuit 40 by SRAM 41.) In turn, the output 59 of circuit 57 is applied to the Post Decode circuit 60. At present, it is sufficient to say that the Post Decode circuit 60 can inspect via programmatic criteria both incoming error information 59 and (previously) stored error information 60 (stored in Error Catch RAM) to produce condensed and more readily interpretable error information which may then by stored back into the Error Catch RAM 32 via path 61. An example would be to create a count of how many times there was an error within a particular range of addresses, which information may be useful in deciding when to attempt to engage in on-chip repair by enabling substitute circuits.

We turn now to the Period Generator 49 and its associated Timing SRAM 51. These respond to an eight bit signal T_SEL 43 that, for each two hundred and eight bit instruction fetched by the Micro-Controller Sequencer 19, determines a duration for the associated operation of the Timing/Formatting & Comparison circuit 52. T_SEL 43 is member of the Various Control Values & Instructions 42 that are represented by the different fields within the fetched instruction. As an eight bit value it can represent or encode two hundred and fifty-six different things. In this case those "things" are twenty-eight bit values stored in the Timing SRAM 51 and that are addressed by T_SEL. Each addressed twenty-eight bit value (23) specifies a desired duration with a 19.5 picosecond resolution. The sequence of accessed twenty-eight bit duration values (23) is stored in a Period FIFO 50 so that the individual members of that sequence will be retrieved and applied in synchronism with the retrieval of their intended corresponding vector, which is stored in the Vector FIFO 45.

A coarse timing value field in the oldest entry in the FIFO 50 conveys duration information with a resolution of 5 nsec, and produces therefrom a signal VEC_FIFO_UNLOAD 47 that transfers the next transmit vector from the Vector FIFO 45 to the Timing/Formatting & Comparison circuit 52. A companion signal TIMING REMAINDER 48 is also applied to circuit 52. It is there that the ultimate resolution to 19.5 picoseconds is accomplished.

Figure 3:
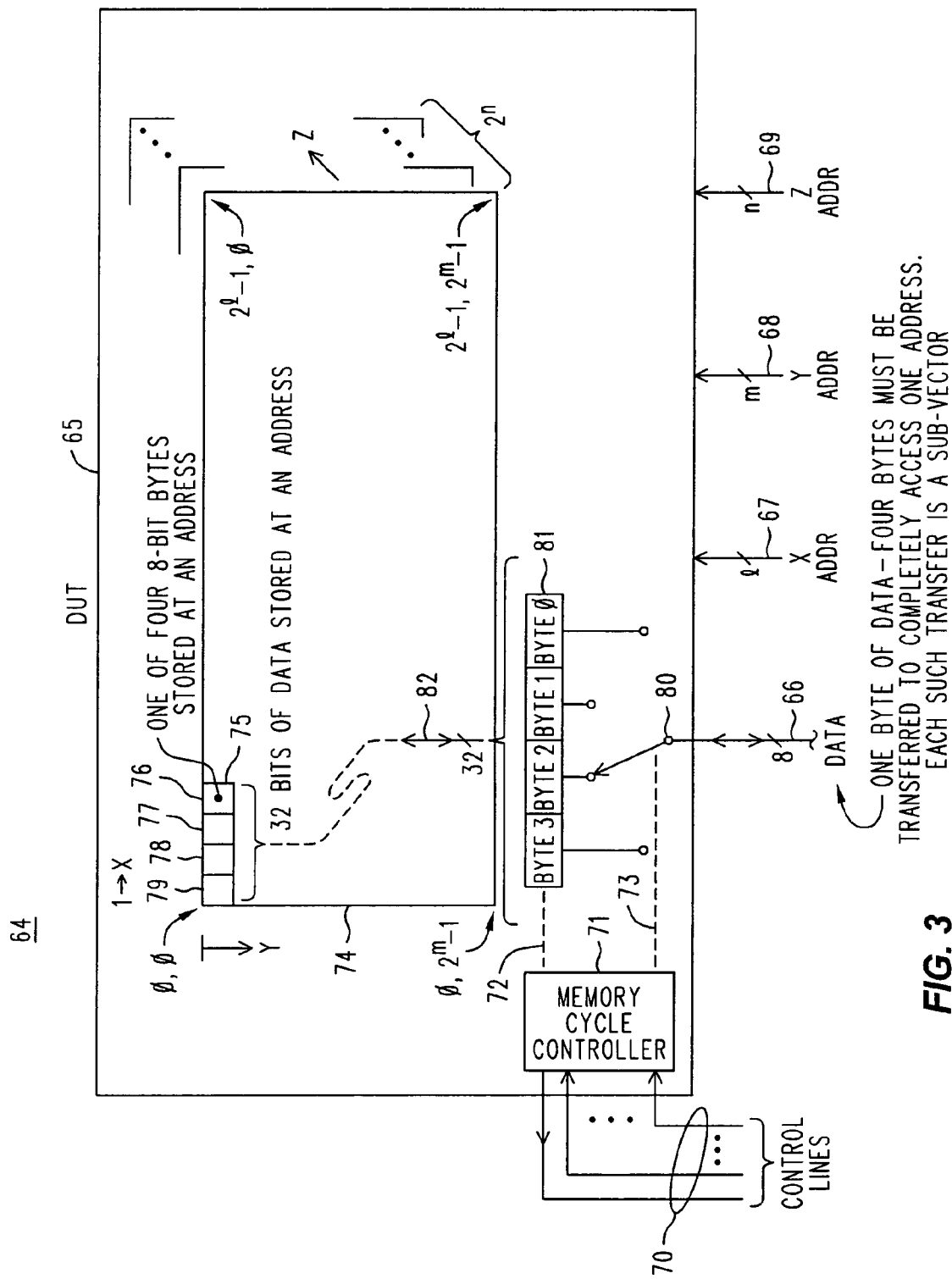
FIG. 3 is a simplified functional block diagram of an example DUT that employs the serial transmission of data bytes that form a larger word.

Refer now to FIG. 3, which is a simplified functional block diagram 64 of a DUT 65 that incorporates "squeezing" on its data lines 66. In this particular example each address contains a thirty-two bit data word that went over the electrical interface as sequence of four separate eight-bit bytes. Thus word 75 can be described as being the result of writing the four bytes 76–79. In this example the addressing of the DUT is quite ordinary: X, Y and Z address bits (67–69) of 1-many, m-many and n-many bits, respectively. Since we show a Z address 69, we also indicate a plurality of $2^n$ pages (or other noun), of which page 74 might represent the page associated with Z=0. In this example the addressing operation has not been "squeezed" down to less than (1+m+n)-many bits, although we shall briefly describe below how that may be done, as well. In this example only the data path has been squeezed, and is in need of serializing and sub-vector support for ease of test program creation.

In our example DUT the four bytes 76–79 are not internally stored in word 75 with four internal operations. It is true that the DUT as a whole would experience four consecutive memory cycles to get the four bytes to transit the data path 66. An internal multiplexing or switching mechanism 80 controlled by a memory cycle controller 71 would direct the sequential accumulation of the four bytes into a unified in-line presentation 82 available from register 81. From there it can be written into word 75. The reverse operations take care of reading. A collection of control lines 70 inform the memory cycle controller as to what manner of operation is desired.

Now, it is not our purpose here to dwell at great length about how this example DUT 65 works. It is a hypothetical part, although there are conventional parts that work as set out, or in similar or equivalent ways, as well as ones that are sort of like that, but are, well, different. The sub-vector serialization technique to be described is flexible, and accommodates many different cases. It is sufficient for us to list what some of these cases might be, and leave it to the memory designers to implement them in their own fashion.

First, and simplest, the DUT 65 might always operate with a fully expressed address and squeezed data, for every memory cycle. In this scenario it is only necessary for the control lines 70 to manage, or perhaps simply assist in, the task of keeping track of where in where in groups of four is the present byte. In other circumstances, perhaps as part of some ASIC having an onboard memory, data is sometimes squeezed and sometimes not. Perhaps one of either address or data is squeezed, or, perhaps one or neither. Whatever, it is a mode of operation, and some combination of control lines (a write of a control code to a control register) would establish that mode of operation. As far as the memory tester is concerned, such control information is transmitted just as is any other vector. But it may happen, then, that between this (mode control) vector and that one, all intervening traffic to the data lines is performed with serialized sub-vectors. That fact would be mirrored in the way the test program was written. The possibilities range from the simple to the complex, and one would rightfully expect a corresponding level of control sophistication within the DUT, matched by programming constructs in the test program, to explain how it all happens. The thing we want to avoid is having to write the test program in a way where each sub-vector is generated separately and independently, with the same degree of effort and overhead as is normally associated with the production of a regular vector. We want to be able to write the test program almost as if there were no squeezing going on. To do that will require some hardware support and some associated constructs in the language used to write the test program. Our plan is to describe the hardware used to transmit sub-vectors, and then the hardware used to receive and compare them, and finally describe the associated programming constructs.

Before beginning those tasks, however, we return briefly to FIG. 3, and mention that if the address were to be squeezed, then there would be a reduced address field (not shown) going into the DUT, and an address related switching mechanism (not shown) corresponding to 80 for the data would assemble the consecutive bytes (of however many bits) into a complete address, which would then be the X, Y and Z addresses shown. Upon reflection, it is likely that the same number of (simultaneous) sub-vectors would be needed to transmit an entire address and its associated (write) data. That is, four consecutive sub-vectors for the data (four times eight is thirty-two) could be simultaneous with four eight-bit address sub-vectors. Using eight four-bit instances of one in conjunction with four eight-bit instances of the other would be pretty strange, indeed.

Figure 4:
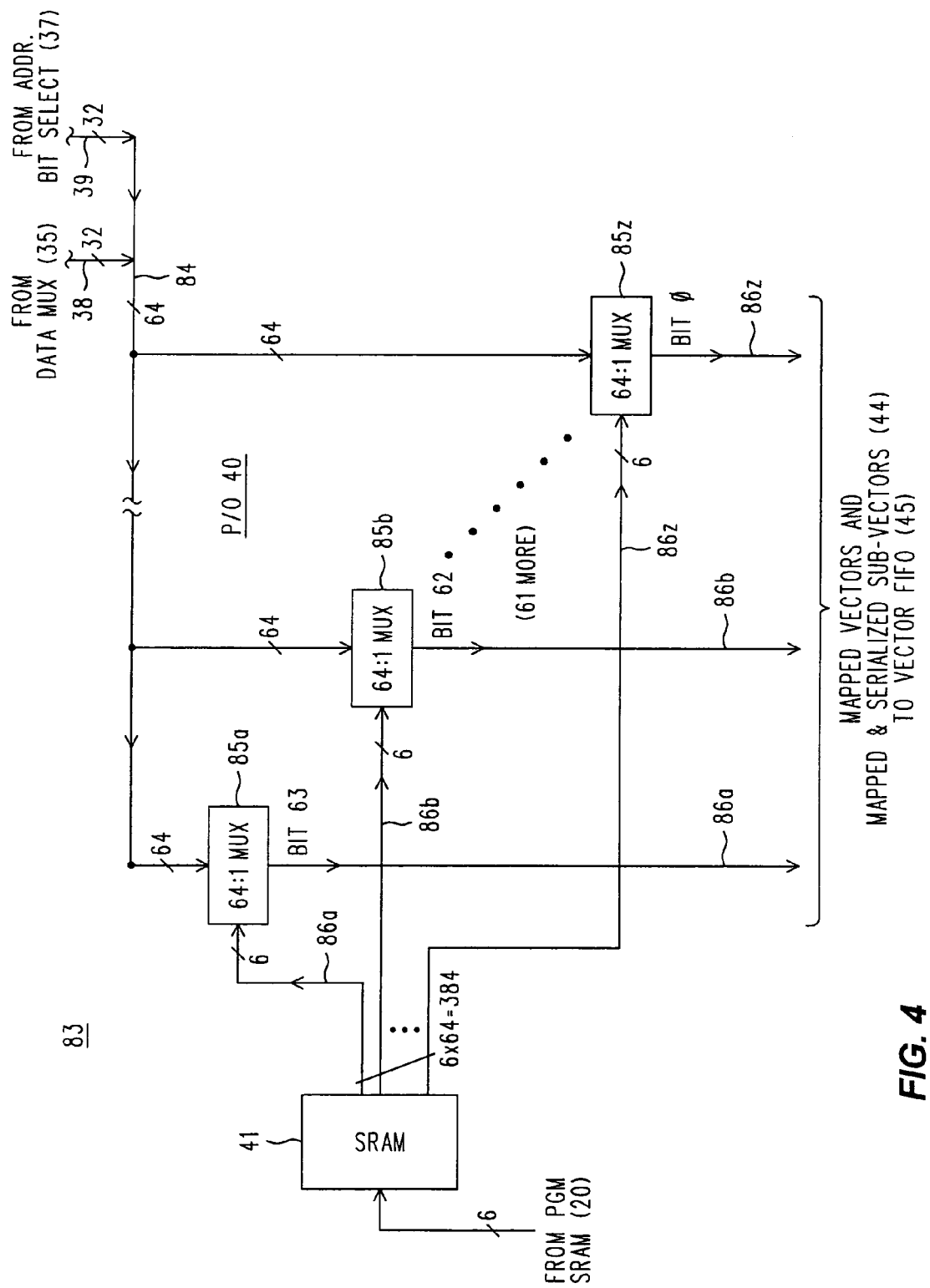
FIG. 4 is a simplified block diagram of an arbitrary dynamic mapping and serializer mechanism for the creation of transmitted sub-vectors.

Refer now to FIG. 4, wherein is shown as a simplified block diagram 83 an arbitrary mapping and serializing mechanism located in the Transmit Vector Mapper/Serializer . . . circuit 40 and its associated SRAM 41. The "raw material", as it were, for vectors to be transmitted to the DUT, or for expected receive vector results, are the data 38 from the Data MUX 35 and the address bits 39 from the Address Bit Select Circuit 39. These are each 32-bit fields that are treated by circuit 40 as a combined 64-bit entity. In high level terms that combined entity is a vector that some portion thereof will either be transmitted or used as a template for comparison against a received vector. It is, however, unmapped, and may contain fields that need to be arbitrarily dynamically mapped to create the serialization of subvectors. Now, in such a case where, say, four consecutive sub-vectors are needed, then there will indeed be four consecutive 64-bit entities 84 that each contribute a different field to the (probably the same) mapped bit positions of the resulting sub-vectors. It is not envisioned that one 64-bit entity 84 is captured and then "sliced-up" into the four sub-vectors. Instead, the programming constructs to be discussed allow the convenient creation of the needed abundance of the needed "raw material" (vectors) mentioned above. In short, the programming constructs will allow the definition of a sequence of multiple arbitrary mappings to be applied to corresponding repeated instances of one vector value to conveniently create a desired sequence of subvectors, as opposed to the need to create and send each sub-vector from scratch.

Accordingly, each of the sixty-four bits of a vector on lines 84 is applied to an associated one of a collection of sixty-four 64:1 MUX'es 85a–85z. Each such MUX uses an associated six bit code (86a–86z) to determine which of the applied sixty-four bits 84 ($2^6$=64) is to appear as the associated output bit (86a–86z). These six bit codes 86a–86z are individual fields in a 384-bit output (6×64=384) from SRAM 41. This accomplishes an arbitrary reordering (mapping) of the bits 84 to become output bits 44. To serialize, that mapping changes from one input vector (84) to the next, to create the sequence of what we have been calling sub-vectors. The actual content of the SRAM 41 originates from either the Test Site Controller 4 or the Micro-Controller Sequencer 19, but the addresses applied to SRAM 41 to access that content exists as parameter values stored in the PGM SRAM 20 as a result of compiler operation upon the source code for the test program. The addressable SRAM 41 contains the sequence of (perhaps eight) 384-bit MUX control words that arbitrarily dynamically map eight consecutive unmapped vectors (on lines 84) to become eight sub-vectors on lines 44. That is, a sequence of eight unmapped vectors might have a 32-bit data field to be squeezed down to four bits sent eight times. We think of these eight unmapped vectors as collectively containing eight adjacent and non-overlapping four bit fields, each of which will be in its turn mapped into the same four bit field in a sequence of eight sub-vectors. The original eight unmapped vectors might be eight instances of the same vector, or they might be eight different vectors.

Figure 5:
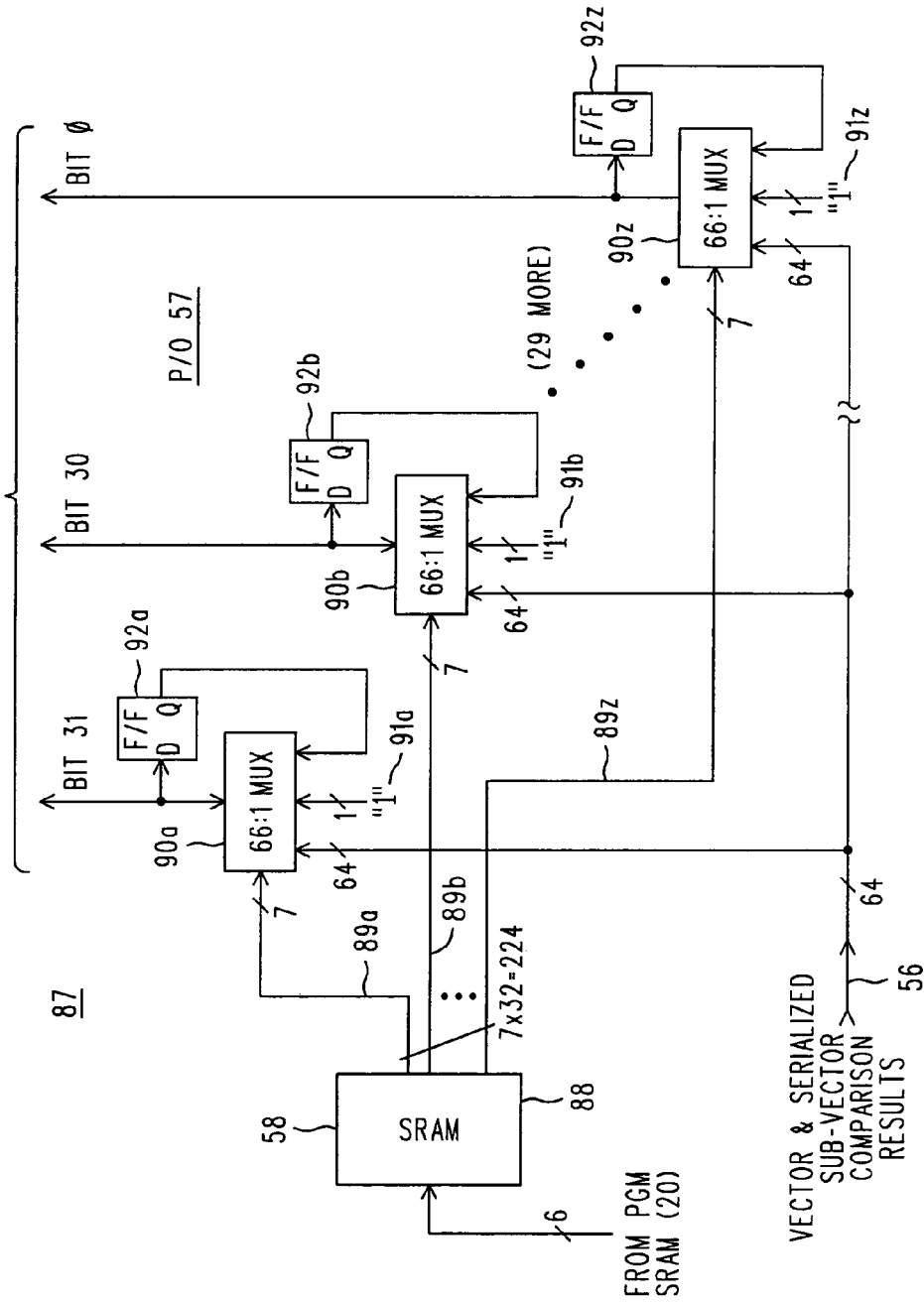
FIG. 5 is a simplified block diagram of dynamic reverse mapper and de-serializer mechanism for combining received sub-vectors into unmapped vectors.

Let us now consider what must be done to accommodate receive vectors and receive sub-vectors that are still serialized, all of which are in need of reverse mapping, and all the while keeping in mind that received vector information is the result of the comparison process. We shall do this with the help of the simplified block diagram segment 87 of FIG. 5, which is essentially circuit 57 of FIG. 2.

The first thing to note is that the input 56 is a 64-bit entity that reflects the comparison results obtained by the Timing/Formatting & Comparison circuit 52; it is not the raw received vector or sub-vector itself. A "1" in a bit position indicates a successful comparison (no failure). If that input is comparison results for a regular vector that does not need de-serialization, then it is reverse mapped by a mapping process that is performed by a collection of thirty-two MUX'es 90a–90z according to associated seven bit fields of MUX control bits 89a–89z. These thirty-two fields originate with data stored in the SRAM 88 (which is the same as SRAM 58 in FIG. 2) by action of the Micro-Controller Sequencer 19, and most likely from stored parameters within the PGM SRAM, in particular. In any event, the principle of operation is the same as that of the mapper shown in FIG. 4, except that the mapping of FIG. 5 would typically be the inverse of that performed by FIG. 4. There are only thirty-two MUX'es, since we assume that there are at most thirty-two data bits for the DUT, and address bits do not produce comparison results.

We are more interested in the case where the comparison results 56 are for a sub-vector and de-serialization is required. In this case there are groups of MUX'es that correspond to the destination locations within the re-assembled vector to be created from the sequence of sub-vectors. Those groups of MUX'es are sequentially pointed at their associated bits as they occur. D flip/flops 92a–92z capture the results, and serve as the memory for the de-serialization to unitary in-line presentation process. So, if there were eight four-bit sub-vectors to be de-serialized, the first seven groups would latch their associated four bits each, for a total of twenty-eight bits variously held in some subset of flip/flops 92a–92z. The eighth group would also set its flip/flops, but would be taken as a result without needing the latching action of the flip/flops. At the same time (i.e., during the eighth group) the code sent to the MUX'es for the other seven groups would instruct those MUX'es to select the contents of their associated flip/flops as the output. Thus it is that the latched comparison results for the previous seven groups are reunited, as it were, with the comparison results for the eighth group. Meanwhile, the needed reverse mapping is applied piecemeal, a group at a time, so that the final result 59 is entirely un-mapped once it is available.

There remains only the "1" inputs 91a–91z to the MUX'es. These are provided to force a given bit in the final comparison results to indicate "no failure" so that bits that are not of interest can be ignored.

It will be noted, then, that these extra inputs to the MUX'es (the flip/flop outputs and the "1's") each add to the sixty-four bits of input to their associated MUX. That is why these MUX'es are 66:1 MUX'es, and why they require a seven bit control input instead of a six bit input.

It has previously been mentioned that there is test program compiler support (in the form of allowing programming constructs in the test program language) that enhance arbitrary dynamic mapping and the generation of sub-vectors. It is now time to discuss those programming constructs (see FIGS. 6A–C).

FIGS. 6A–C are a an illustrative example segment 93 of test program source code that involves sub-vectors for data (not address) squeezing, after the fashion of the hypothetical DUT shown in FIG. 3. The only significant difference is that the DUT for the code segment 93 of FIG. 6 has no Z address; to adapt FIG. 3 to the present example simply ignore anything in FIG. 3 that pertains to a Z address, and assume that it stores 16×16 (=256) 32-bit words of data. Let there be eight address pins (X[3:0] and Y[3:0]), a control pin WnR (Write not-Read, write =1), a DataValid signal and only an 8-bit data bus. Channels 32–39 will be the address pins, while channels 0–7 will be the data pins. Channel 40 will be used for the Write not-Read bit, while channel 41 will be used for the DataValid signal. The programmer wishes to write patterns to the DUT, store errors that are detected and analyze the failures as though the DUT were a 32-bit device, rather than allowing the 8-bit interface to make it appear that the device were simply an 8-bit device. The data sent by the program segment 93 in FIG. 6 is shown in Table I below, and is not necessarily representative of a realistic DUT test. Instead, it has been chosen to make it easier in the example to appreciate the way data is serialized. The data can be described as a function of the address, in that the lower sixteen bits are created by (X*16+Y) and the upper sixteen bits are the inversion of that quantity.

TABLE I

| X | Y | DATA |
|---|---|------|
| 0 | 0 | 0xffff0000 |
| 0 | 1 | 0xfffe0001 |
| 0 | 2 | 0xfffd0002 |
| ... | ... | ... |
| 0 | 15 | 0xfff0000f |
| 1 | 0 | 0xffef0010 |
| ... | ... | ... |
| 15 | 15 | 0xff0000ff |

We should mention some additional useful preliminaries. The test program language from which the example of FIG. 6 is formed is largely conventional, and may be appreciated from study of the documentation provided by the manufacturer. In particular, the interested reader may wish to peruse a manual in a big thick binder entitled "VK Series Test Systems Introduction to Programming". The May 1996 edition has Hewlett-Packard part number E 7095-90006. What is described therein is something called the VersaTest Pattern Language for a memory tester of the VK 1000 series. The stuff in FIG. 6 is of the same ilk, but with extensions. The present extended compiler is a program written in PERL (an interpreted premiere string manipulation language) whose listing on 8.5 by 11 inch paper is about half an inch thick. The character sequences acam and ecam occur frequently in the code segment. They are acronyms for historically explainable noun phrases that no longer seem appropriate. They remain in use for compatibility reasons. The character sequence acam should be understood as output oriented and relating to circuit 40, and ecam should be understood as input oriented and relating to circuit 57. Finally, the program segment shown in FIG. 6 has source code line numbers appended to it along the left edge. These were put there strictly for clarity and convenience in this description. The code segment in FIG. 6 is a segment that would otherwise compile and operate as described, except that those line numbers would first need to be removed.

The significant operative portions of the code segment 93 in FIG. 6 that are of interest here are explained below.

At lines 1–4 the various channel assignments for groups of related signals are established and given useful, but arbitrary, names (labels).

At lines 5–12 there are @acam and @ecam statements that are named declarations that establish the correspondence (mapping) between channels and bit positions. The parameters within an @acam statement are arranged as {<channel number>: <bit position>, <channel number>: <bit position>, ... }. The parameters within an @ecam statement are arranged as {<bit position>: <channel number>, <bit position>: <channel number>, ... }. Following the @acam or @ecam is a label (e.g., in line 5 the label is "acambits1st") that may be descriptive or suggestive to the programmer of the meaning or use for that mapping. In any event, the label associated with such a declaration can thereafter be used in other statements to reference the actual mapping of the declaration, so that those big long ugly things need be typed in only once. There is in this example a similarity between the patterns for the declarations of lines 5–8 and those of lines 9–12. That similarity is typical, and arises from the ecam mapping being the inverse of the acam mapping. Upon reflection, however, it will be appreciated that this is not an essential condition. For example, the ecam mapping might be something different than the inverse, based on some internal operations performed by the DUT, or for some other reason. In principle, it can be any mapping the test program writer wants.

The working parts of the program segment are the loops LOOP_WRITE (lines 20–26) and LOOP_READ (lines 28–32). The LOOP_WRITE statements include ones that are of the form @acam <label>; These successive lines (20–23) are successive statements that use the different mappings named acambits1st, acambits2nd, acambits3rd and acambits4th to modify the item being output. The thing that is being output (continuously) is x, y, dh and dl. Line 24 adjusts the values of x, y, dh and dl, and completes the loop. The LOOP_READ loop is similar, except that lines 28–31 include @ecam mapping statements that map comparison results from circuit 52 (Timing Formatting & Comparison) to circuit 60 (Post Decode). Here is a hint for those who have not seen this kind of thing before. LOOP_READ includes output operations of address and data, as well as a change of the DUT mode so that it can be read from. The address is applied to the DUT as an "output" operation by the tester hardware. The accompanying data is not sent out but is instead captured in the circuit 52 to be used as comparison data. (This works, since one would not write to a DUT that one is reading from at the same time.) The data read from the DUT is compared and those results are what are sent forward to circuit 57 for reverse mapping or for de-serialization.

What the compiler does when it encounters the program segment 93 of FIGS. 6A–C is to take note of the named declarations of lines 5–8 and prepare MUX 85a–z control contents (86a–z) for storage into SRAM 41. Each labeled declaration will thus have associated implementing patterns stored at an address in SRAM 41. At places in the test program where that part of the dynamic mapping is needed the associated address is applied to the SRAM 41. These addresses are stored by the compiler in the PGM SRAM 20 in locations that correspond to test program operations that require them. Thus, the arbitrary dynamic mapping that is needed by test program execution is fetched along with the other operations that make up the program.

A similar explanation applies to the contents of SRAM 58 for ecam labels that produce MUX 90*a–z* control contents (89*a–z*), and the addresses applied to SRAM 58. This action provides the desired reverse (un-) mapping or de-serialization of the comparison results.

Figure 7:
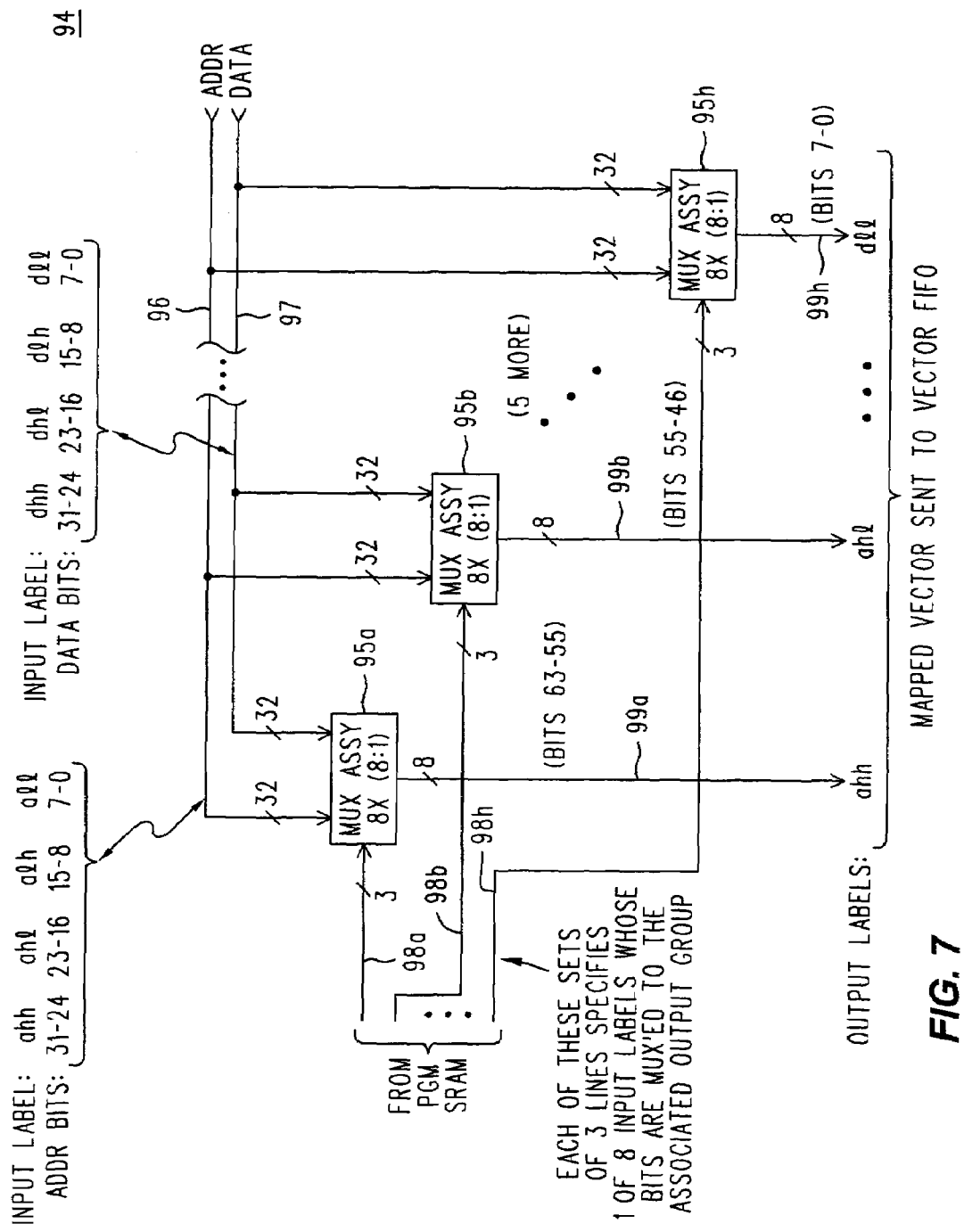
FIG. 7 is a simplified block diagram of a prior art mapper that, while dynamic, was not arbitrary, and for which programming constructs persist in legacy test programs and must therefore be supported in new equipment.

An earlier version of a similar memory tester also had a limited dynamic mapping capability that had associated therewith certain dedicated syntactical forms recognized by the compiler. We wish to retain backward compatibility with test programs incorporating those constructs, even though they are to be run on a new tester that has different mapping hardware, and that is not subject to the limitations. To explain this aspect of the present memory tester we shall need to refer to FIG. 7, which is a simplified block diagram 94 of the prior art mapper of interest.

In the prior art block diagram 94 there are two 32-bit collections of information: ADDR (address) 96 and DATA 97. They correspond respectively to collections 39 and 38 of FIG. 2. There are eight MUX ASSY's (95*a*–95*h*), each of which is an eight-gang arrangement of 8:1 MUX's. Each MUX ASSY 95*a*–95*h* is controlled by an associated separate collection of three control lines, 98*a*–98*h*, respectively.

The collection of address information 96 is divided into four input groups ahh, ahl, alh and all; the a denotes address, the middle h/l denotes which 16-bit half (high or low) and the rightmost h/l denotes high or low byte within the 16-bit. These input groups have fixed bit positions, as shown in the figure. Similarly, the collection of data information 97 is divided into the input four groups dhh, dhl, dlh and dll. The d denotes data, and the h/l's are as above, but for the thirty-two bits of data. Each MUX ASSY gets as input all eight input groups. The three control lines (98) associated with a MUX ASSY indicate which of the eight groups is to be selected as the output (99) from that MUX ASSY. The outputs 99*a*–99*h* of the MUX ASSY's 95*a*–95*h* are each eight bit quantities, with which output labels or bit positions in a transmit vector may be associated. The notion of output bit positions is not so bad; it fits readily into the scheme of things shown in FIG. 2. Unfortunately, the programming constructs current at the time this was done favored an ordering of the output labels, which as a collection of symbols or text strings, happens to be the same set as the input labels: ahh, . . . , all, dhh, . . . , dll. This makes for some awkward syntax, but that's what was done. So, the old form of a transmit vector might be:

dlh←ahh, dll←dhl;

The idea is that this represents the form <output label>←<input label>. Note that since this older system employed specific symbols (the ahh, ahl, dhh, etc.) and that they each had particular bit position correspondence, there existed no generalized mapping statements such as those of lines 5–12 in FIG. 6.

We are now in a position to answer the question of what the present compiler is to do when it encounters a vector expressed in the old form. First, the compiler has a knowledge of what the old input and output labels used to refer to. Also, it assumes a correspondence between the two 32-bit input groups of the old arrangement and the new architecture. That is, the old ADDR 96 might be understood as new bit positions 32–63, and DATA 97 as new bit positions 0–31.

The bit positions of the input groups for ADDR 96 would now become thirty-two counts larger than they were: e.g., ahl would now be 55–43. Likewise, the old output labels are ordered and naturally map into the single 63-0 ordering that we have been using up to this point. So far, so good. Now what is needed is for the compiler to simply recognize instances of the old form, synthesize an appropriate mapping statement, and insert it (or pretend to) into the test program source code as if it were there all along. It generates a system created label for each such instance not already having such a label created for it. Suppose the example vector shown above in the old form vector notation was issued the label % XXX. Then we would expect the compiler to create or observe the following declaration:

@acam % XXX {15:63, 14:62, 13:61, 12:60, 11:59, 10:58, 9:57, 8:56, 7:23, 6:22, 5:21, 4:20, 3:19, 2:18, 1:17, 0:16}

Then at those places in the program where the actual output is to occur the compiler would simply synthesize the statement:

@acam % XXX;

Thus, the old functionality is preserved for execution on the new hardware and no old test programs have to be re-written on this account.

We claim:

1. A de-serializing circuit for a receive sub-vector that is a subset of Q-many bits associated with a previous serialization and whose de-serialized version is one member of a sequential plurality of similarly de-serialized received sub-vectors that combine to form a complete receive vector that is subsequently operated upon by a test system, the de-serializing circuit comprising:

Q-many MUX's, each MUX having at least (Q+1)-many data inputs to which are coupled the bits of a receive sub-vector to be de-serialized, the correspondence between the (Q+1)-many data inputs and the bits of the receive sub-vector to be de-serialized being the same for each MUX;

each MUX having an output bit that will represent the signal at one of the (Q+1)-many data inputs of that MUX;

Q-many latches, each latch associated with a MUX and having an input coupled to the output bit of its associated MUX and also having an output coupled to an input of its associated MUX;

each MUX also having a collection of at least m control inputs, $2^m \geq Q+1$, to which are coupled, for each MUX, a corresponding separate collection of control signals whose values indicate which of the (Q+1)-many data inputs will have its signal coupled to the output bit of that MUX;

a memory having an address and containing addressable locations each storing a set of control signal values of (Q·m)-many bits representing the respective values of the m-many control signals for the Q-many MUX's and also having data outputs coupling members of the set of control signal values to the control inputs of their respective MUX's;

the output bits for the Q-many MUX's forming an accumulated latched collection of sub-vectors constituting a de-serialized receive vector, according to a de-serialization defined by the addressed set of control signal values; and a programmatically controlled address applied to the memory and that selects a pre-defined de-serialization stored in the memory and that is to be performed upon the receive sub-vectors.

2. A combined mapping and serialization circuit for altering an original transmit vector of Q-many bits whose altered version is to be applied to a DUT, the combined mapping and serialization circuit comprising:
- n-many MUX's, $n \leq Q$, each MUX having at least Q-many data inputs to which are coupled the Q-many bits of an original transmit vector to be altered, the correspondence between the Q-many data inputs and the Q-many bits of the original transmit vector to be altered being the same for each MUX;
- each MUX having an output bit that will represent the signal at one of the Q-many data inputs of that MUX;
- each MUX also having a collection of at least m control inputs, $2^m \geq Q$, to which are coupled, for each MUX, a corresponding separate collection of control signals whose values indicate which of the Q-many data inputs will have its signal coupled to the output bit of that MUX;
- a memory having an address and containing addressable locations each storing a set of control signal values of (m·n)-many bits representing the respective values of the m-many control signals for the n-many MUX's and also having data outputs coupling members of the set of control signal values to the control inputs of their respective MUX's;
- the output bits for the n-many MUX's forming an alteration of the original transmit vector, the alteration constituting one of: (a) a mapped transmit vector whose Q-many bits are re-ordered according to a mapping defined by the addressed set of control signal values; or (b) a sequential collection of non-re-ordered signals, each collection being one of a plurality of transmit sub-vectors each having less than Q-many bits and the sequence of the collections being according to a serialization defined by the addressed set of control signal values; or (c) a sequential collection of re-ordered signals, each collection being one of a plurality of transmit sub-vectors each having less than Q-many bits that have also been re-ordered according to a mapping defined by the addresses set of control signal values, and the sequence of the collections being according to a serialization defined by the addressed set of control signal values; and
- a programmatically controlled address applied to the memory and that selects a pre-defined alteration stored in the memory and that is to be performed upon the original transmit vector.

3. A de-serialization and reverse mapping circuit for a series of receive sub-vectors each of which is a subset of Q-many bits associated with a previous serialization and whose de-serialized version and reverse mapped version is a complete receive vector that is subsequently operated upon by a test system, the de-serializing and reverse mapping circuit comprising:
- Q-many MUX's, each MUX having at least (Q+1)-many data inputs to which are coupled the bits of a receive sub-vector to be de-serialized, the correspondence between the (Q+1)-many data inputs and the bits of the receive sub-vector to be de-serialized being the same for each MUX;
- each MUX having an output bit that will represent the signal at one of the (Q+1)-many data inputs of that MUX;
- Q-many latches, each latch associated with a MUX and having an input coupled to the output bit of its associated MUX and also having an output coupled to an input of its associated MUX;
- each MUX also having a collection of at least m control inputs, $2^m \geq Q+1$, to which are coupled, for each MUX, a corresponding separate collection of control signals whose values indicate which of the (Q+1)-many data inputs will have its signal coupled to the output bit of that MUX;
- a memory having an address and containing addressable locations each storing a set of control signal values of (Q·m)-many bits representing the respective values of the m-many control signals for the Q-many MUX's and also having data outputs coupling members of the set of control signal values to the control inputs of their respective MUX's;
- the output bits for the Q-many MUX's forming an accumulated latched collection of sub-vectors constituting a de-serialized and reverse mapped receive vector, according to a de-serialization and a reverse mapping defined by the addressed set of control signal values; and
- a programmatically controlled address applied to the memory and that selects a per-defined de-serialization/reverse mapping combination stored in the memory and that is to be performed upon the sequence of receive sub-vectors after they have been received and latched.

* * * * *